United States Patent
Schoen et al.

(10) Patent No.: US 9,266,719 B2
(45) Date of Patent: *Feb. 23, 2016

(54) METHODS OF MANUFACTURE MEMS DEVICES

(75) Inventors: Florian Schoen, Munich (DE);
Wolfgang Raberg, Sauerlach (DE);
Bernhard Winkler, Munich (DE);
Werner Weber, Munich (DE)

(73) Assignee: Infineon Technologies AG, Neubiberg (DE)

( * ) Notice: Subject to any disclaimer, the term of this patent is extended or adjusted under 35 U.S.C. 154(b) by 902 days.

This patent is subject to a terminal disclaimer.

(21) Appl. No.: 13/406,069

(22) Filed: Feb. 27, 2012

(65) Prior Publication Data

US 2012/0164774 A1  Jun. 28, 2012

Related U.S. Application Data

(60) Division of application No. 12/853,814, filed on Aug. 10, 2010, now Pat. No. 8,198,690, which is a continuation-in-part of application No. 12/013,174, filed on Jan. 11, 2008, now Pat. No. 7,851,875.

(51) Int. Cl.
*H01L 41/00* (2013.01)
*B81C 1/00* (2006.01)
*H01L 41/09* (2006.01)

(52) U.S. Cl.
CPC ..... *B81C 1/00182* (2013.01); *B81B 2201/0271* (2013.01); *H01L 41/0933* (2013.01)

(58) Field of Classification Search
None
See application file for complete search history.

(56) References Cited

U.S. PATENT DOCUMENTS

| | | |
|---|---|---|
| 5,747,353 A | 5/1998 | Bashir et al. |
| 5,846,849 A | 12/1998 | Shaw et al. |
| 6,531,331 B1 | 3/2003 | Bennett et al. |
| 6,624,726 B2 | 9/2003 | Niu et al. |
| 6,861,277 B1 | 3/2005 | Monroe et al. |
| 6,936,491 B2 | 8/2005 | Partridge et al. |
| 6,960,488 B2 | 11/2005 | Brosnihan et al. |
| 7,002,436 B2 | 2/2006 | Ma et al. |

(Continued)

FOREIGN PATENT DOCUMENTS

| | | |
|---|---|---|
| DE | 10 2008 062 499 A1 | 7/2009 |
| WO | WO 2008/001253 A2 | 1/2008 |

OTHER PUBLICATIONS

Young, S., et al., "A novel low-temperature method to fabricate MEMS resonators using PMGI as a sacrificial layer," Journal of Micromechanics and Microengineering, 2005, pp. 1824-1830, vol. 15, IOP Publishing, Ltd., Bristol, UK.

*Primary Examiner* — Benjamin Sandvik
(74) *Attorney, Agent, or Firm* — Slater & Matsil, L.L.P.

(57) ABSTRACT

Micro-electromechanical system (MEMS) devices and methods of manufacture thereof are disclosed. In one embodiment, a MEMS device includes a first semiconductive material and at least one trench disposed in the first semiconductive material, the at least one trench having a sidewall. An insulating material layer is disposed over an upper portion of the sidewall of the at least one trench in the first semiconductive material and over a portion of a top surface of the first semiconductive material proximate the sidewall. A second semiconductive material or a conductive material is disposed within the at least one trench and at least over the insulating material layer disposed over the portion of the top surface of the first semiconductive material proximate the sidewall.

22 Claims, 7 Drawing Sheets

(56) References Cited

U.S. PATENT DOCUMENTS

| | | |
|---|---|---|
| 7,023,065 B2 | 4/2006 | Ayazi et al. |
| 7,071,031 B2 | 7/2006 | Pogge et al. |
| 7,138,694 B2 | 11/2006 | Nunan et al. |
| 7,172,917 B2 | 2/2007 | Partridge et al. |
| 7,256,107 B2 | 8/2007 | Takeuchi et al. |
| 7,543,496 B2 | 6/2009 | Ayazi et al. |
| 8,198,690 B2 * | 6/2012 | Schoen et al. ............ 257/415 |
| 2003/0112096 A1 | 6/2003 | Potter |
| 2004/0150043 A1 | 8/2004 | Holm et al. |
| 2004/0227201 A1 | 11/2004 | Borwick, III et al. |
| 2006/0208833 A1 | 9/2006 | Sung et al. |
| 2007/0170439 A1 | 7/2007 | Partridge et al. |
| 2007/0170528 A1 | 7/2007 | Partridge et al. |
| 2008/0050861 A1 | 2/2008 | Vancura et al. |
| 2009/0179286 A1 | 7/2009 | Schoen et al. |
| 2009/0278628 A1 | 11/2009 | Sworowski et al. |

\* cited by examiner

METHODS OF MANUFACTURE MEMS DEVICES

This is a divisional application of U.S. application Ser. No. 12/853,814, which was filed on Aug. 10, 2010, which is a continuation application of U.S. application Ser. No. 12/013,174, which was filed on Jan. 11, 2008, both of which are incorporated herein by reference.

TECHNICAL FIELD

The present invention relates generally to the fabrication of micro-electromechanical system (MEMS) devices, and more particularly to the fabrication of resonators and other moveable elements of MEMS devices.

BACKGROUND

MEMS devices comprise a relatively new technology that combines semiconductors with very small mechanical devices. MEMS devices are micro-machined sensors, actuators, and other structures that are formed by the addition, subtraction, modification, and patterning of materials using techniques originally developed for the integrated circuit industry. MEMS devices are used in a variety of applications, such as in sensors for motion controllers, inkjet printers, airbags, microphones, and gyroscopes. The applications that MEMS devices are used in continue to expand and now include applications such as mobile phones, automobiles, global positioning systems (GPS), video games, consumer electronics, automotive safety, and medical technology, as examples.

Manufacturing MEMS devices is challenging in many aspects. Fabricating small moving parts of MEMS devices with lithography processes used in semiconductor technology has limitations in some applications. Reducing the size of spaces between moving and stationary parts of MEMS devices is limited to minimum feature sizes that are printable using a particular lithography system and process, for example.

Thus, what are needed in the art are improved structures for MEMS devices and methods of manufacture thereof.

SUMMARY OF THE INVENTION

These and other problems are generally solved or circumvented, and technical advantages are generally achieved, by embodiments of the present invention, which provide novel MEMS devices and methods of manufacture thereof, wherein a sacrificial insulating material layer is used to form novel MEMS structures having sub-lithographic dimensions.

In accordance with an embodiment of the present invention, a MEMS device includes a first semiconductive material and at least one trench disposed in the first semiconductive material. The at least one trench has a sidewall. An insulating material layer is disposed over an upper portion of the sidewall of the at least one trench in the first semiconductive material and over a portion of a top surface of the first semiconductive material proximate the sidewall. A second semiconductive material or a conductive material is disposed within the at least one trench and at least over the insulating material layer disposed over the portion of the top surface of the first semiconductive material proximate the sidewall.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments of the present invention and are not necessarily drawn to scale.

DETAILED DESCRIPTION OF ILLUSTRATIVE EMBODIMENTS

The making and using of various embodiments of the invention are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

MEMS resonators offer significant advantages compared to quartz resonators in terms of size, shock resistance, electromagnetic compatibility performance, and integratability into complementary metal oxide semiconductor (CMOS) circuitry. One challenge in MEMS devices is the high motional resistance of the device compared to quartz, which inhibits direct replacement of a quartz resonator by a silicon resonator in some applications. In addition, high voltages between the electrodes are often needed to obtain a sufficient signal.

Embodiments of the invention provide structures for electrostatically actuated silicon MEMS resonators and methods of fabrication thereof. The novel MEMS devices comprise sub-lithographic vertical gaps having dimensions as small as a few nanometers between crystalline silicon electrodes. The MEMS devices exhibit high resonator quality factors and excellent electrical coupling factors, resulting in low motional resistance values for MEMS resonators and low actuation voltages compatible with standard CMOS circuitry.

The present invention will be described with respect to embodiments in specific contexts, namely implemented in MEMS devices comprising moveable elements that comprise resonators. Embodiments of the invention may also be implemented in other applications such as MEMS devices comprising sensors, actuators, accelerometers, and other MEMS structures having floating or moveable parts and elements, for example.

Embodiments of the present invention achieve technical advantages by providing novel MEMS devices and methods of manufacture thereof. FIGS. 1 through 4 show cross-sectional views of a method of manufacturing a MEMS device 100 at various stages in accordance with an embodiment of the present invention, wherein a thin insulating material layer is used to form a space or gap between two semiconductive features, or between a semiconductive feature and a conductive feature.

Figure 1:
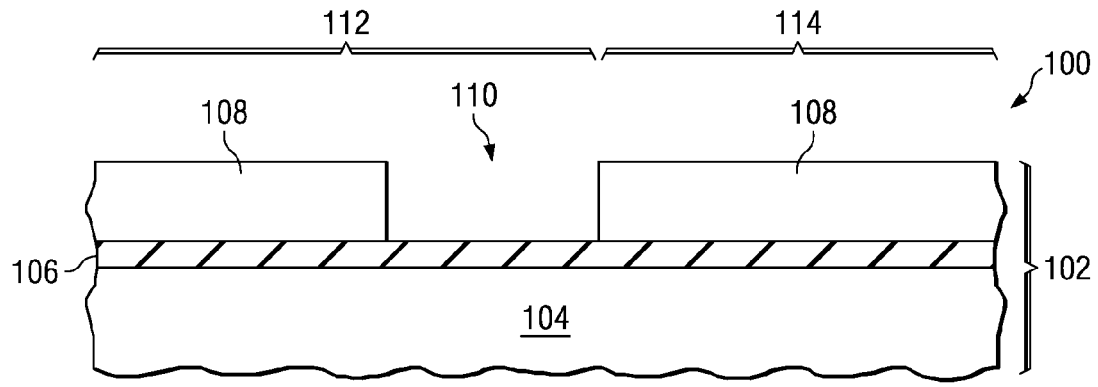
FIGS. 1 through 4 show cross-sectional views of a method of manufacturing a MEMS device at various stages in accordance with an embodiment of the present invention, wherein a thin insulating material layer is used to form a space or gap between two semiconductive features.

Referring first to FIG. 1, to fabricate the MEMS device 100, a workpiece 102 is provided. The workpiece 102 may include a semiconductor substrate 104 or body comprising silicon or other semiconductor materials covered by an insulating layer 106, for example. The workpiece 102 may also include other active components or circuits, not shown. The workpiece 102 may include other conductive layers or other semiconductor elements, e.g., transistors, diodes, etc. Compound semiconductors, GaAs, InP, Si/Ge, or SiC, as examples, may be used in place of silicon. The substrate 104 preferably comprises single crystal silicon, in some embodiments, for example, although alternatively the substrate 104 may comprise amorphous silicon or polycrystalline silicon (polysilicon).

The workpiece 102 includes an insulating layer 106 disposed over the substrate 104. The insulating layer 106 preferably comprises a thickness of about 500 nm, for example, although alternatively, the insulating layer 106 may comprise other dimensions. The insulating layer 106 may comprise silicon dioxide, silicon nitride, or combinations thereof, although other insulators may also be used. The insulating layer 106 is also referred to herein as a buried oxide layer.

A semiconductive material 108 is disposed over the insulating layer 106. The semiconductive material 108 may comprise a thickness of about 1 to 20 μm, and in some applications may comprise a thickness of about 10 μm, for example. The semiconductive material 108 preferably comprises similar materials as described for the substrate 104, for example. Alternatively, the semiconductive material 108 may comprise other materials and dimensions. In some embodiments, the semiconductive material 108 preferably comprises single crystal silicon. The semiconductive material 108 may also comprise amorphous silicon or polysilicon. The semiconductive material 108 is also referred to herein as a first semiconductive material.

The workpiece 102 preferably comprises a silicon-on-insulator (SOI) substrate in some embodiments, for example. Alternatively, a substrate 104 comprising bulk silicon may be provided, the insulating layer 106 may be formed over the substrate 104, and the first semiconductive material 108 may be formed over the insulating layer 106. The workpiece 102 includes the substrate 104, the insulating layer 106, and the first semiconductive material 108.

At least one trench 110 is formed in the first semiconductive material 108, as shown in FIG. 1. Only one trench 110 is shown in FIGS. 1 through 4; however, preferably a plurality of trenches 110 is simultaneously formed across the surface of the workpiece 102, for example. The trench 110 may be formed by depositing a layer of photosensitive material (not shown) over the workpiece 102, patterning the layer of photosensitive material using a lithography mask and a lithography system (also not shown), developing the layer of photosensitive material, and using the layer of photosensitive material as a mask while exposed portions of the semiconductive material 108 are etched away.

The trench 110 preferably comprises a width of about several hundreds of nm to about one μm or greater, and a depth comprising the entire thickness of the semiconductive material 108, for example. Alternatively, the trench 110 may comprise other dimensions.

The trench 110 is preferably formed in a first region 112 of the workpiece 102. The first region 112 of the workpiece 102 may comprise a region where an electrode or other element of a MEMS device 100 will be formed, for example. The first region 112 of the workpiece 102 preferably comprises a region where a portion of the first semiconductive material 108 will remain adhered or attached to the substrate 104, in some embodiments. The first region 112 is located adjacent a second region 114 of the workpiece 102, as shown. The second region 114 comprises a region where supportive material around a portion of the semiconductive material 108 will be removed later. The second region 114 is also referred to herein as a release region, for example. The second region 114 comprises a region where a resonator or other moveable element of the MEMS device 100 will be formed, for example.

The at least one trench 110 formed in the first semiconductive material 108 comprises a first sidewall, e.g., the left sidewall shown in FIG. 1, and a second sidewall opposite the first sidewall, e.g., the right sidewall in FIG. 1. After the trench 110 is formed, the top surface of the buried oxide layer 106 at the bottom of the trench 110 is left exposed, as shown.

Figure 2:
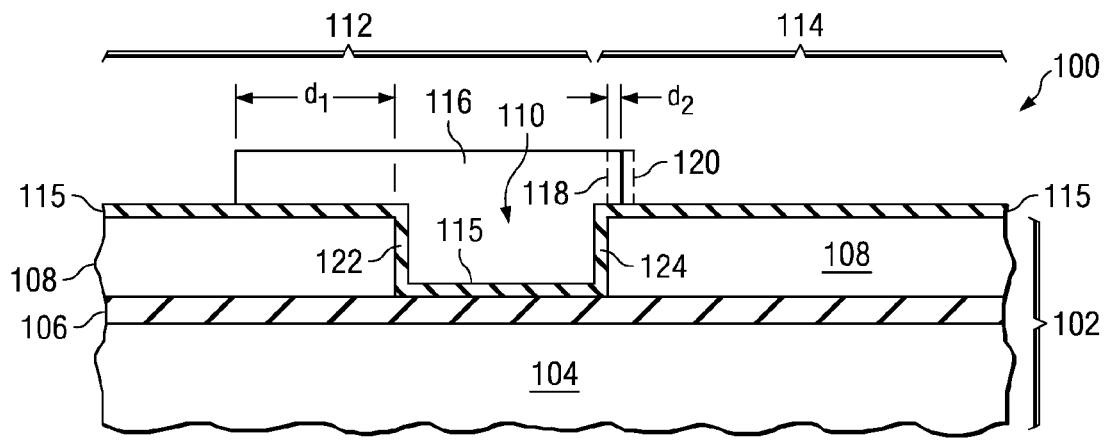

An insulating material layer 115 is formed over the top surface of the first semiconductive material 108, the first and second sidewalls of the at least one trench 110 in the first semiconductive material 116, and the exposed top surface of the buried oxide layer 106, as shown in FIG. 2. The insulating material layer 115 comprises a sacrificial material layer in the second region 114 of the workpiece 102. The insulating material layer 115 will be removed later from the second region 114 and from portions of the first region 112. Portions of the insulating material layer 115 will remain proximate and lining the first sidewall to adhere a second semiconductive material 116 to the first semiconductive material 108 in the first region 112, to be described further herein. The insulating material layer 115 is also referred to herein as a second insulating material layer, e.g., with respect to the embodiment shown in FIGS. 5 through 9.

Referring again to FIG. 2, the insulating material layer 115 preferably comprises silicon dioxide or silicon nitride deposited as a very thin film and having a thickness of about 100 nm or less in some embodiments, for example. The insulating material layer 115 may be formed by thin film deposition or by an oven process such as oxidation or nitridation, as examples. The insulating material layer 115 may also be deposited using low pressure chemical vapor deposition (LPCVD) or atomic layer deposition (ALD), as examples.

The insulating material layer 115 may comprise LPCVD tetra ethyl oxysilane (TEOS), for example. The insulating material layer 115 may comprise other materials and dimensions, and may be deposited using other methods, for example.

In some embodiments, the insulating material layer 115 is conformal, comprising substantially the same dimension on top surfaces and on the sidewalls of the trench 110. In other embodiments, the insulating material layer 115 is non-conformal, to be described further herein with respect to the embodiments shown in FIGS. 11 through 16.

A material 116 is disposed over the insulating material layer 115. The material 116 is also referred to herein as a second semiconductive material or a conductive material 116 in some embodiments, for example. The material 116 fills the at least one trench 110 and covers the insulating material layer 115. The material 116 may comprise a thickness of about 20 to 100 nm or greater above a top surface of the insulating material layer 115, e.g., over the top surface of the first semiconductive material 108, for example, although alternatively, the material 116 may comprise other dimensions. The material 116 preferably comprises a material resistant to a subsequent etch process for the sacrificial layer, e.g., the insulating material layer 115.

The material 116 may comprise a second semiconductive material comprising a semiconductor material such as polysilicon, although alternatively, the second semiconductive material layer 116 may comprise other materials, such as amorphous or crystalline silicon, as examples. The second semiconductive material 116 may be doped to increase the conductivity. In some embodiments, the second semiconductive material 116 preferably comprises polysilicon doped with a dopant such as As, B, or P to improve the conductivity, although alternatively, other dopants may also be used. The second semiconductive material 116 may comprise in-situ doped polysilicon deposited using LPCVD or other methods, for example. In other embodiments, the second semiconductive material 116 may comprise amorphous or single crystal silicon, for example.

The material 116 may also comprise a conductive material in some embodiments. The conductive material 116 may comprise a metal such as W, Al, or other metals compatible with the processing methods of the MEMS device 100, for example. The conductive material 116 may also include one or more liners, for example, combined with one or more layers or alloys of these metals.

The second semiconductive material or conductive material 116 is patterned using a layer of photosensitive material and a lithography process, removing portions of the second semiconductive material or conductive material 116 from over the top surface of the insulating material layer 115, as shown in FIG. 2. The second semiconductive material or conductive material 116 may be patterned using a wet chemical etching process, for example, although other methods may also be used. The second semiconductive material or conductive material 116 is left remaining within the at least one trench 110 and over a portion of the insulating material layer 115 on the top surface of the first semiconductive material 108 proximate at least the first sidewall of the at least one trench 110.

For example, after patterning, the second semiconductive material or conductive material 116 preferably extends over the first semiconductive material 108 from the first sidewall by a dimension $d_1$ proximate the first sidewall, e.g., on the left of the trench 110. Dimension $d_1$ may comprise about 0.5 to 5 μm, for example, although dimension $d_1$ may alternatively comprise other amounts. Dimension $d_1$ is also referred to herein as a first dimension. Dimension $d_1$ is preferably relatively wide so that a portion of the insulating material layer 115 will remain beneath the second semiconductive material or conductive material 116 after the subsequent etch process of the insulating material layer 115, to be described further herein.

The second semiconductive material or conductive material 116 preferably extends over the first semiconductive material 108 from the second sidewall by a dimension $d_2$ proximate the second sidewall, e.g., on the right of the trench 110. Dimension $d_2$ may comprise about 400 nm or less, for example, although dimension $d_2$ may alternatively comprise other amounts. Dimension $d_2$ is also referred to herein as a second dimension. The second semiconductive material or conductive material 116 may extend above the top surface of the first semiconductive material 108 by about 10 to 100 nm or greater, for example.

Dimension $d_1$ is preferably larger than dimension $d_2$. In some embodiments, dimension $d_1$ is greater than dimension $d_2$ by about 50% or greater, for example. The relative size of dimensions $d_1$ and $d_2$ is preferably controlled to ensure that a predetermined amount or portion of the insulating material layer 115 remains beneath the second semiconductive material or conductive material 116 after the subsequent etch process of the insulating material layer 115, for example.

Because of lithography variations, the amount or dimension $d_2$ that the second semiconductive material or conductive material 116 extends over the top surface of the first semiconductive material 108 proximate the second sidewall may vary, e.g., from edge 118 to edge 120, as shown in phantom in FIG. 2. However, preferably, the second semiconductive material or conductive material 116 edge 118 or 120 resides at least over the insulating material layer 115 disposed along the second sidewall, in accordance with embodiments of the present invention. More preferably, the edge 118 or 120 of the second semiconductive material or conductive material 116 is disposed over a portion of the first semiconductive material 108, for example. Dimension $d_2$ is preferably a positive value in accordance with some embodiments of the present invention, for example; however, alternatively, dimension $d_2$ may also be zero.

In accordance with embodiments of the present invention, the edge of the active gap 124 trench to be etched later is carefully defined, in order to well-define the edge of the lever of the resonator or moveable element 130 (see FIG. 3) formed from the first semiconductive material 108 on the right side of FIG. 2 in the release region 114. Lithography variations, e.g., from edge 118 to 120 shown in FIG. 2, are preferably taken into account in the definition of the edge of the active gap 124. To achieve this, the electrode or second semiconductive material or conductive material 116 is defined to have the small overlap of dimension $d_2$ comprising about 100 to 400 nm in some embodiments, depending on the process technology used, with the underlying device, e.g., over the first semiconductive material 108. In contrast to the active gap 124, the electrically inactive gap 122 is protected from the etchant of the subsequent etch process used to remove the insulating material layer 115 from the active gap 124 by the large overlap comprising dimension $d_1$ which comprises about 0.5 μm to several, e.g., 5, μm between the electrode or second semiconductive material or conductive material 116 and the device layer or first conductive material 108 proximate the inactive gap 122. For example, the overlap on the left side comprising dimension $d_1$ is preferably designed to be much wider than the height of the active gap 124, e.g., wherein the height of the active gap 124 is substantially the same as the thickness of the first semiconductive material 108, in accordance with some embodiments of the present invention.

Figure 3:
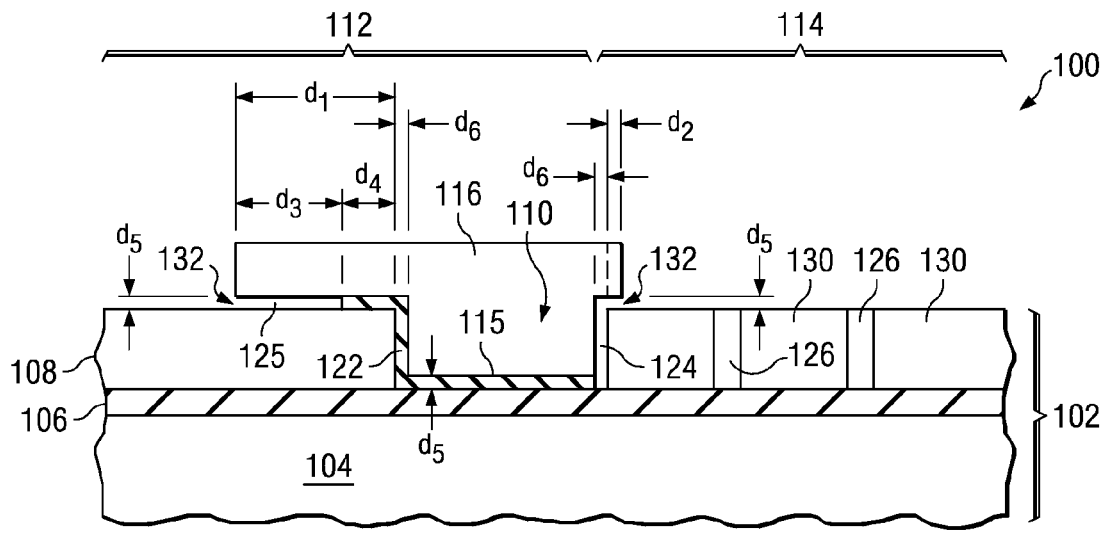

Portions of the insulating material layer 115 are then removed using an etch process, as shown in FIG. 3. Region 122 comprising the insulating material layer 115 proximate the first sidewall comprises an inactive gap, and region 124 proximate the second sidewall comprises an active gap. At least a portion of the insulating material layer 115 is left remaining in the inactive gap 122, and preferably all of the insulating material layer 115 is removed from the active gap 124. The active gap 124 is also referred to herein as a first gap 124, for example.

For example, after the patterning of the second semiconductive material or conductive material 116, the MEMS device 100 is subjected to an etch process, e.g., a wet chemical etching process, to remove portions of the insulating material layer 115. Alternatively, other etch methods may be used to remove portions of the insulating material layer 115. The etch process removes all of the insulating material layer 115 from the exposed top surface of the first semiconductive material 108. The etchant of the etch process also enters into the openings 132 on the left and right side of the second semiconductive material or conductive material 116, e.g., beneath the second semiconductive material or conductive material 116, removing portions of the insulating material layer 115 beneath the second semiconductive material or conductive material 116.

For example, on the left side of FIG. 3, the insulating material layer 115 is removed by an amount or dimension $d_3$ laterally from beneath the second semiconductive material or conductive material 116. A portion of the insulating material layer 115 is left remaining proximate the first sidewall and inactive gap 122, as shown. The portion of the insulating material layer 115 left remaining comprises a dimension $d_4$ extending along the top surface of the first semiconductive material 108 away from the inactive gap 122. The removed insulating material layer 115 beneath the second semiconductive material or conductive material 116 forms a gap 125 comprising a dimension $d_5$ that comprises a dimension substantially equal to the thickness of the insulating material layer 115, for example. The gap 125 comprises a width extending away from the inactive gap 122 of dimension $d_3$.

The etch process also results in the removal of the insulating material layer 115 proximate the second sidewall and the active gap 124. The etchant of the etch process enters into the opening 132 proximate the second sidewall, and results in the removal of the insulating material layer 115 completely from the second sidewall and the active gap 124, as shown in FIG. 3. The thickness of the active gap 124 comprises a dimension $d_6$ that is substantially equal to the thickness of the insulating material layer 115 on the second sidewall before the removal of the insulating material layer 115, for example.

At this point, the insulating material layer 115 may be left remaining beneath the second semiconductive material or conductive material 116 within the at least one trench 110, as shown. The insulating material layer 115 also resides along the first sidewall in the inactive gap 122 and between the top surface of the first semiconductive material 108 and the second semiconductive material or conductive material 116 proximate the first sidewall, e.g., to the right of the gap 125.

The insulating material layer 115 comprises a thin sacrificial layer that is used to define the thickness of the active gap 124 in accordance with embodiments of the present invention. The thickness and dimensions of the insulating material layer 115 determine the dimensions of gaps 124 and 125 that are formed when portions of the insulating material 115 are removed. For example, after depositing the insulating material layer 115, the insulating material layer 115 may comprise a dimension $d_5$ on top surfaces, e.g., on the top surface of the first semiconductive material 108 and on the bottom surface of the trench 110, e.g., on the top surface of the buried oxide layer 106. The insulating material layer 115 may comprise a dimension $d_6$ on sidewalls of the trench 110. In the embodiment shown in FIGS. 1 through 4, the insulating material layer 115 is conformal and comprises substantially the same dimension on the sidewalls of the trench 110 and top surfaces of the first semiconductive material 108 and the buried oxide layer 106. Thus, dimension $d_5$ and $d_6$ are substantially equal in this embodiment, for example.

When portions of the insulating material layer 115 are removed, the gap 125 comprises dimension $d_5$ that was defined by the dimension $d_5$ of the insulating material layer 115 on the top surface of the first semiconductive material 108 prior to the removal of the insulating material layer 115. The opening 132 proximate the first sidewall and inactive gap 122 also substantially comprises dimension $d_5$, for example. Likewise, when portions of the insulating material layer 115 are removed, the active gap 124 comprises dimension $d_6$ defined by the dimension $d_6$ of the insulating material layer 115 on the sidewalls of the first semiconductive material 108 prior to the removal of the insulating material layer 115. The opening 132 proximate the second sidewall and active gap 124 comprises dimension $d_5$, e.g., the dimension $d_5$ of the insulating material layer 115 on the top surface of the first semiconductive material 108 proximate the second sidewall prior to the removal of the insulating material layer 115.

Because the second semiconductive material or conductive material 116 comprises a greater width (e.g., dimension $d_1$) over the first semiconductive material 108 extending away from the first sidewall than the width (e.g., dimension $d_2$) of the second semiconductive material or conductive material 116 over the first semiconductive material 108 extending away from the second sidewall, advantageously, after the etch process for the insulating material layer 115, some of the insulating material layer 115 remains residing between the top surface of the first semiconductive material 108 and the second semiconductive material or conductive material 116 proximate the first sidewall. However, after the etch process, all of the insulating material layer 115 is removed from between the top surface of the first semiconductive material 108 and the second semiconductive material or conductive material 116 proximate the second sidewall, and all of the insulating material layer 115 lining the second sidewall is also removed. Again, the dimensions of $d_1$ and $d_2$ are preferably designed to achieve these results, in accordance with embodiments of the present invention.

Figure 4:
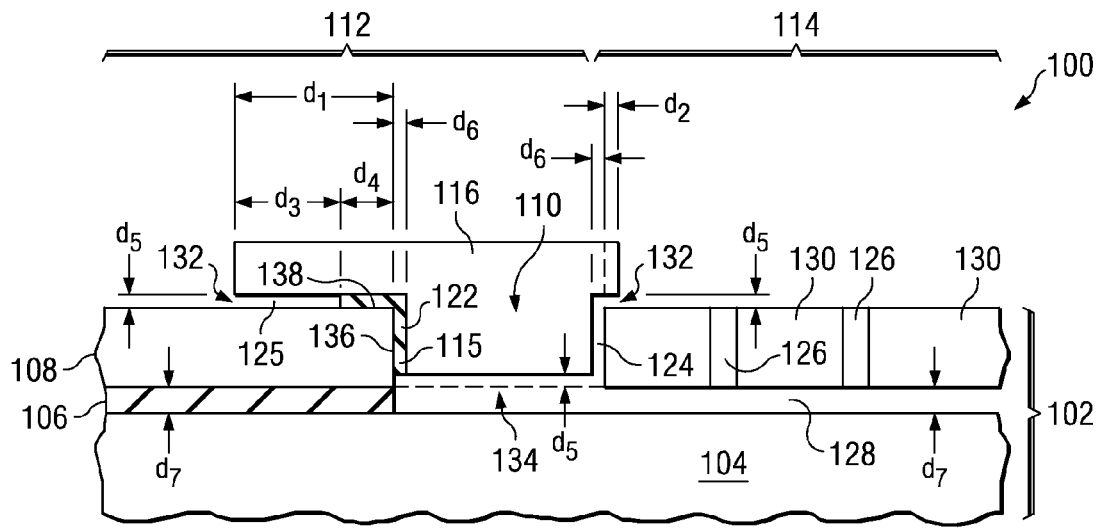

In accordance with some embodiments of the present invention, at least one release hole 126 may be formed in the first semiconductive material 108, as shown in FIG. 3, either before or after the etch process to remove the insulating material layer 115 from the second sidewall as shown in FIG. 3. Another etch process (or the same etch process previously described may be continued) may be used to remove additional portions of the insulating material layer 115 and also a portion of the buried oxide layer 106, as shown in FIG. 4. Note that the buried oxide layer 106 and the insulating material layer 115 preferably comprise materials that may be etched using the same etch process, for example, in accordance with some embodiments of the present invention. The buried oxide layer 106 is left residing beneath a portion of the first semiconductive material 108 beneath the second semiconductive material or conductive material 116 which may comprise an electrode 116 in some embodiments.

The etchant of the etch process enters into the release holes 126 and into the openings 132, removing the buried oxide layer 106 at least from beneath the first semiconductive material 108 proximate the second sidewall. The etch process may also remove at least a portion of the buried oxide layer 106 from beneath a portion of the second semiconductive material or conductive material 116 in the trench 110, as shown in FIG. 4. The buried oxide layer 106 comprises a thickness comprising a dimension $d_7$. The gap 128 formed beneath the first semiconductive material 108 proximate the second sidewall and active gap 124 in the second region 114 comprises a dimension $d_7$ that is substantially equal to the thickness of the buried oxide layer 106, for example.

In the first region 112, the insulating material layer 115 may also be removed from between at least a portion of the second semiconductive material or conductive material 116 and the substrate 104 in the trench 110, forming a gap 134 comprising a dimension $(d_5+d_7)$ that is substantially equal to the dimensions of the insulating material layer 115 and the buried oxide layer 106 prior to their removal, for example.

The gap 134 formed beneath the second semiconductive material or conductive material 116 is also referred to herein as a second gap 134, for example. The gap 128 formed beneath the first semiconductive material 108, e.g., beneath a moveable portion of the first semiconductive material 108 is also referred to herein as a third gap 128, for example. The moveable portion of the first semiconductive material 108 in the second region 114 is also referred to herein as a moveable element 130 or resonator 130 herein, for example.

The openings 132 may be smaller than the release openings 126 in some embodiments, for example, so that only a small portion of the etchant enters the openings 132, and therefore only a small amount of the insulating material layer 115 may be removed proximate the first sidewall or inactive gap 122 during the portion of the etch process used to remove a portion of the buried oxide layer 106.

After the etch process (or etch processes), the first semiconductive material 108 proximate the second sidewall or active gap 122, e.g., on the right side of the figure, has been completely released. Thus, the released first semiconductive material 108 in the second region 114 comprises a moveable element 130 of the first semiconductive material 108 that is fully released, floating within the right side of the second semiconductive material or conductive material 116 and the substrate 104. Advantageously, a portion of the second semiconductive material or conductive material 116 remains residing over the edge of the moveable element 130, e.g., by dimension $d_2$ in some embodiments, retaining the moveable element 130 vertically within the MEMS device 100. Alternatively, dimension $d_2$ may comprise zero, so that the moveable element 130 may be elevated above the top surface of the MEMS device 100 during operation, e.g., upwardly along the right edge of the second semiconductive material or conductive material 116.

Advantageously, the second semiconductive material or conductive material 116 is disposed in close proximity to the moveable element 130, providing lateral support for the moveable element 130 while being spaced apart by the dimension $d_6$ of the active gap 124, and optionally also providing vertical support while being spaced apart by the dimension $d_5$ of the opening 132, which is also the dimension of the space between the second semiconductive material or conductive material 116 and the moveable element 130. The moveable element 130 is not connected to the substrate 104 and may move freely within the MEMS device 100. The second semiconductive material or conductive material 116 proximate the moveable element 130 in the vertical and/or horizontal direction may function as a mechanical stop for the moveable element 130, or may prevent damage to the moveable element 130 and MEMS device 100 during handling, by limiting or controlling the movement of the moveable element 130, for example. The moveable element 130 is limited to movement within the active gap 124 and beneath the opening 132, if dimension $d_2$ is greater than zero, for example. The moveable element 130 is also referred to herein as a resonator or an oscillating element, for example.

The second semiconductive material or conductive material 116 may comprise an electrode of the MEMS device 100 in some embodiments, for example. Advantageously, the electrode 116 is attached to the workpiece 102 by a portion of the insulating material layer 115 along the first sidewall, e.g., at 136 and also on the top surface of the first semiconductive material 108 proximate the first sidewall, e.g., at 138. The insulating material layer 115 adhering the electrode 116 to the workpiece 102 along the first sidewall has a dimension substantially equal to the thickness of the first semiconductive material 108 less the dimension $d_5$ of a portion of the gap 134. The insulating material layer 115 adhering the electrode 116 to the workpiece 102 proximate the first sidewall on the top surface of the first semiconductive material 108 has a width or dimension $d_4$. The attached electrode 116 provides excellent structural stability for the electrode, or second semiconductive material or conductive material 116 of the MEMS device 100.

Because the thin insulating material layer 115 is used to define the thickness of the gap 124 and opening 132, very small dimensions for the active gap 124 and opening 132 may be achieved, providing improved electromechanical coupling between the electrode 116 and the moveable element 130 in accordance with embodiments of the present invention. For example, the thin insulating material layer 115 may advantageously be formed such that the insulating material layer 115 has sub-lithographic resolution dimensions, e.g., smaller than a minimum feature size than if the gap 124 was printed or formed using the lithography system and processes used to form other material layers of the MEMS device 100.

Note that a single etch process may be used to release the first semiconductive material 108 in the release region 114 of the MEMS device 100. For example, FIG. 3 may show a MEMS device 100 at a point in the manufacturing process partially through the etch process, and FIG. 4 may show the MEMS device 100 at the completion of the etch process.

The moveable element 130 preferably comprises a resonator in accordance with some embodiments of the present invention. The moveable element 130 may also comprise other movable parts and elements used in MEMS devices 100, for example. The moveable element 130 may comprise an oscillating element, an actuator, a sensor, a switch, an accelerometer, or other types of movable elements, as examples.

Only one side of the moveable element 130 is shown in the embodiment illustrated in FIGS. 1 through 4; however, other sides of the moveable element 130 may also be released in accordance with embodiments of the present invention.

For example, FIGS. 5 through 9 show cross-sectional views of a method of manufacturing a MEMS device 200 at various stages in accordance with an embodiment of the present invention, wherein at least two opposing sides of a moveable element 230 are released. Like numerals are used for the various elements that were used to describe FIGS. 1 through 4. To avoid repetition, each reference number shown in FIGS. 5 through 9 is not described again in detail herein. Rather, similar materials are preferably used for the various material layers x02, x04, x06, x08, etc., as were described for FIGS. 1 through 4, where x=1 in FIGS. 1 through 4 and x=2 in FIGS. 5 through 9. As an example, the preferred and alternative materials and dimensions described for the workpiece 102 in the description for FIGS. 1 through 4 are preferably also used for the workpiece 202 shown in FIGS. 5 through 9.

Figure 5:
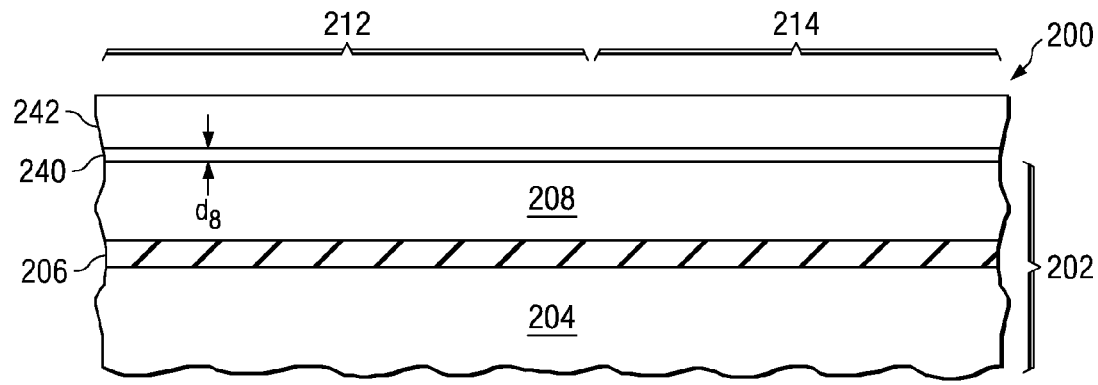
FIGS. 5 through 9 show cross-sectional views of a method of manufacturing a MEMS device at various stages in accordance with an embodiment of the present invention.
Figure 6:
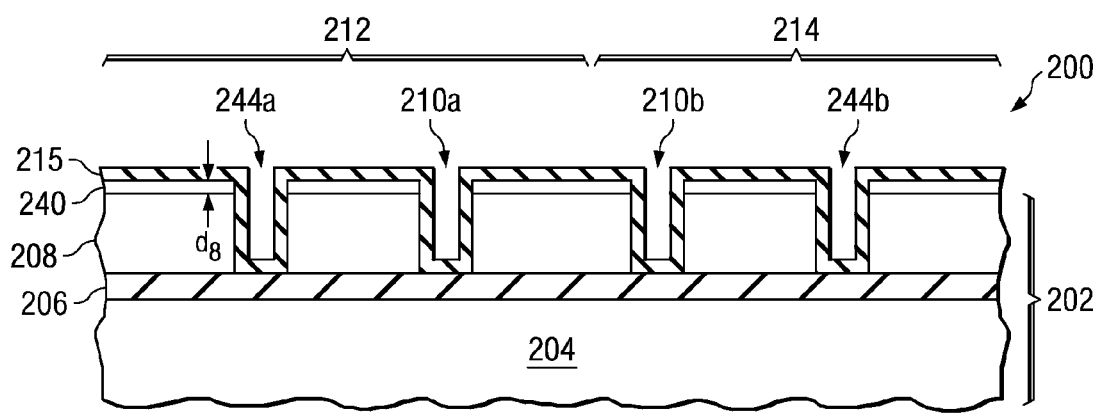

In this embodiment, the insulating material layer 215 (see FIG. 8) may comprise a second insulating material layer 215, and an optional first insulating material layer 240 may be formed over the workpiece 202, as shown in FIG. 5, before patterning the first semiconductive material 208 with a plurality of trenches 210a, 210b, 244a, and 244b, as shown in FIG. 6. The first insulating material layer 240 preferably comprises silicon dioxide in some embodiments, for example. The first insulating material layer 240 preferably comprises the same material as the second insulating material layer 215 and/or the same material as the buried oxide layer 206 in some embodiments. The first insulating material layer 240 preferably comprises a material etchable using the same etchant and the same etch process as the second insulating material layer 215 and/or the same material as the buried oxide layer 206, in some embodiments. Alternatively, the first insulating material layer 240 may comprise a different material than the second insulating material layer 215 or buried oxide layer 206, in other embodiments. The first insulating material layer 240 may comprise silicon nitride, silicon oxynitride, or other insulating materials, as examples. The first insulating material layer 240 preferably comprises a thickness of about 50 nm or less, for example, although alternatively, the first insulating material layer 240 may comprise other dimensions. The first insulating material layer 240 may be deposited by CVD, LPCVD, ALD, or physical vapor deposition (PVD), as examples, although other methods may also be used to form the first insulating material layer 240.

The first insulating material layer 240 is used as a hard mask to pattern the first semiconductive material 208 with trenches. For example, a layer of photoresist 242 is formed over the first insulating material layer 240, and the layer of photoresist 242 is patterned using a lithography mask with the desired pattern for trenches 210a, 210b, 244a, and 244b. The layer of photoresist 242 is used as a mask to pattern the first insulating material layer 240, and then the first insulating material layer 240, or both the first insulating material layer 240 and the layer of photoresist 242, are used as a mask to protect the first layer of semiconductive material 208 while exposed portions of the first layer of semiconductive material 208 are etched away, forming trenches 210a, 210b, 244a, and 244b in the first layer of semiconductive material 208 and also the first insulating material layer 240, as shown in FIG. 6.

In this embodiment, trenches 210a and 210b comprise trenches where electrodes 216a and 216b, respectively, will be formed, and optional trenches 244a and 244b may comprise areas that will remain trenches in the finished structure. Alternatively, trenches 244 and 244b may not be formed in the MEMS device 200, for example.

The second insulating material layer 215 is then deposited over the patterned first insulating material layer 240, over the sidewalls of the first semiconductive material 208, and the top surface of the buried oxide layer 206 exposed at the bottom surface of the trenches 210a, 210b, 244a, and 244b, also shown in FIG. 6.

Figure 7:
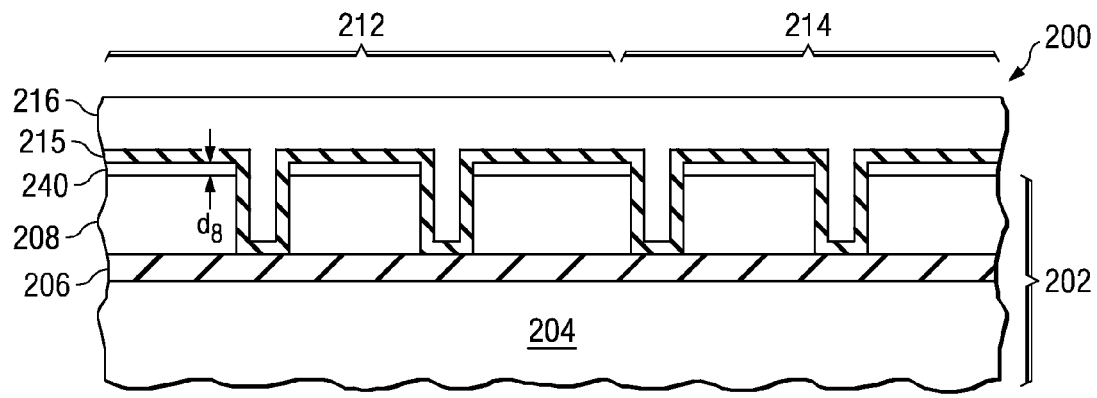
Figure 8:
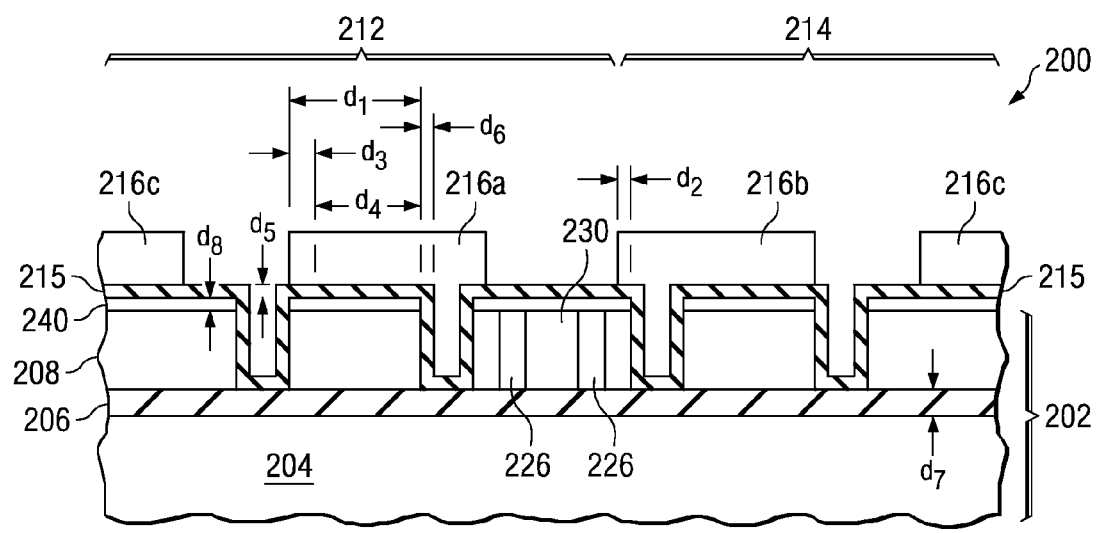

The second semiconductive material or conductive material 216 is then deposited over the second insulating material layer 215, as shown in FIG. 7. The second semiconductive material or conductive material 216 is patterned using lithography, leaving portions of the second semiconductive material or conductive material 216a and 216b remaining in the trenches 210a and 210b, respectively, forming electrodes. A portion of the second semiconductive material or conductive material 216c may also be left remaining in other areas of the MEMS device 200, as shown. The second semiconductive material or conductive material 216 is removed from trenches 244a and 244b. The first semiconductive material 208 disposed between the trenches 210a and 210b will comprise the moveable element 230 of the MEMS device 200 in this embodiment. Release holes 226 may be formed in the moveable element 230, e.g., by patterning the first semiconductive material 208 using lithography, e.g., optionally using the first insulating material layer 240 and the second insulating material layer 215 as a hard mask.

Figure 9:
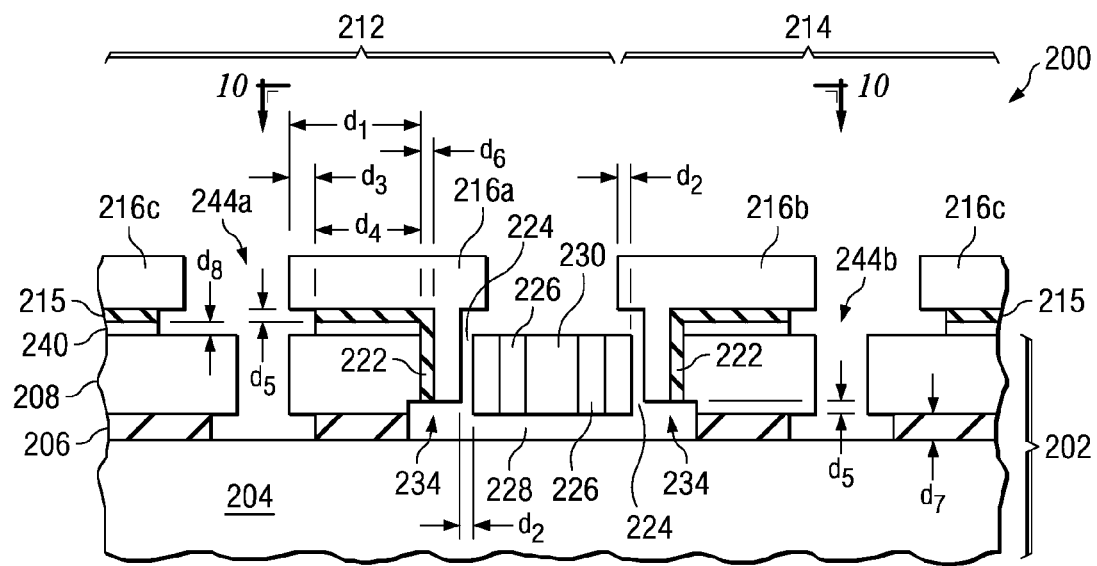

One or more etch processes are used to etch away portions of the second insulating material layer 215, the buried oxide layer 206, and optionally also the first insulating material layer 240, leaving the structure shown in FIG. 9. If the first insulating material layer 240 comprises the same or similar materials as the second insulating material layer 215 and the buried oxide layer 206, the openings 232 are made wider by the amount of the thickness or dimension $d_8$ of the first insulating material layer 240, facilitating the etch process to form the active gaps or first gaps 224. Thus, the first insulating material layer 240 may be used to increase the space, e.g., the openings 232, between the first semiconductive material 208 and the portions of the second semiconductive material or conductive material 216a and 216b (and also second semiconductive material or conductive material 216c) residing over the first semiconductive material 208, advantageously.

In this embodiment, two electrodes 216a and 216b are formed symmetrically about a moveable element 230. The buried oxide layer 206 is preferably completely removed beneath the moveable element 230, forming the third gap 228, so that the moveable element 230 may move freely within the MEMS device 200. At least a portion of the buried oxide layer 206 may also be removed from beneath the second semiconductive material or conductive material 216a and 216b, for example, forming the second gaps 234 within trenches 210a and 210b. Advantageously, the active gaps 224 of the MEMS device 200 are very narrow, comprising a dimension $d_6$, due to the thinness of the sacrificial material comprising the second insulating material layer 215 that was used to form the active gaps 224. In some embodiments, the electrodes 216a and 216b preferably extend over the moveable element 230 by a dimension $d_2$ to function as a mechanical stop above edges of the moveable element 230, e.g., in the vertical direction within the MEMS device 200, for example.

Because the active gaps 224 and the inactive gaps 222 are formed the same insulating material layer 215 on sidewalls of the trenches 210a and 210b, the active gaps 224 and the inactive gaps 222 comprise substantially the same dimension or thickness $d_6$. The inactive gaps 222 are at least partially filled with the insulating material layer 215, for example, which provides attachment of the second semiconductive material or conductive material 216a and 216b to the workpiece 202.

Figure 10:
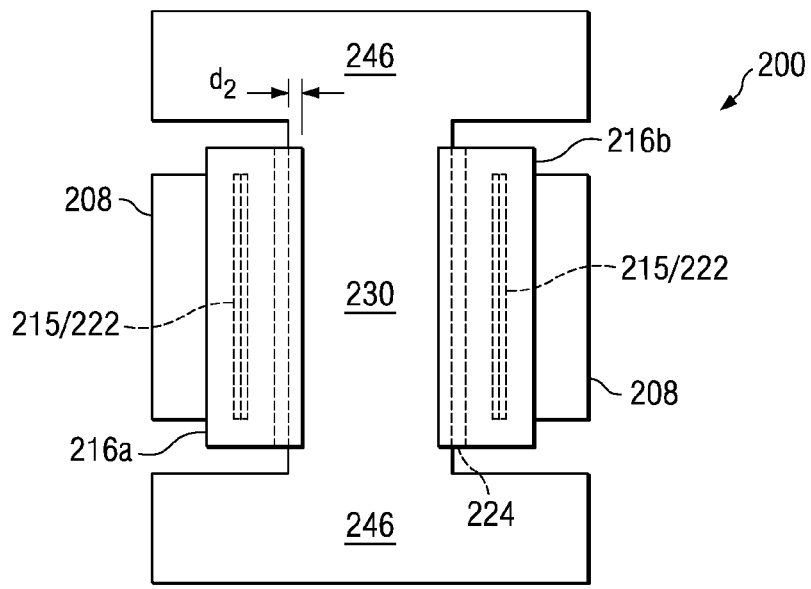
FIG. 10 shows a top view of the MEMS device shown in FIG. 9, wherein the MEMS device comprises a rectangular-shaped resonator.

FIG. 10 shows a top view of the MEMS device 200 shown in FIG. 9. The moveable element 230 may comprise a resonator in some embodiments, for example. The resonator 230 may be anchored at one or more locations. For example, in the embodiment shown in FIG. 10, the resonator 230 comprises an anchor 246 disposed at two opposing ends that is coupled to the workpiece 202 underlying material layers. However, between the two anchors 246, the resonator 230 may move freely within the active gap 224. Alternatively, the resonator 230 may comprise an anchor 246 only at one end, for example, not shown.

Figure 11:
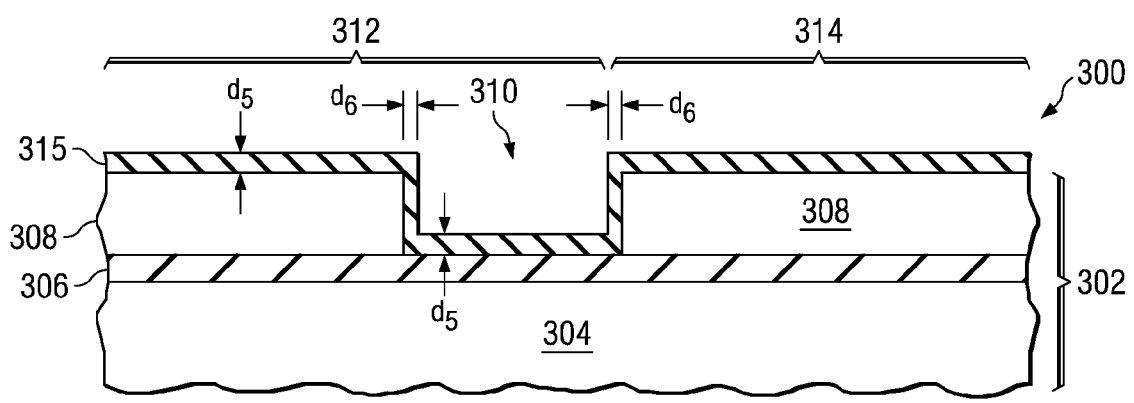
FIGS. 11 through 13 show cross-sectional views of a method of manufacturing a MEMS device at various stages in accordance with another embodiment of the present invention, wherein the thin insulating material layer used to form the gap comprises a greater thickness on top surfaces than on sidewalls of features.
Figure 12:
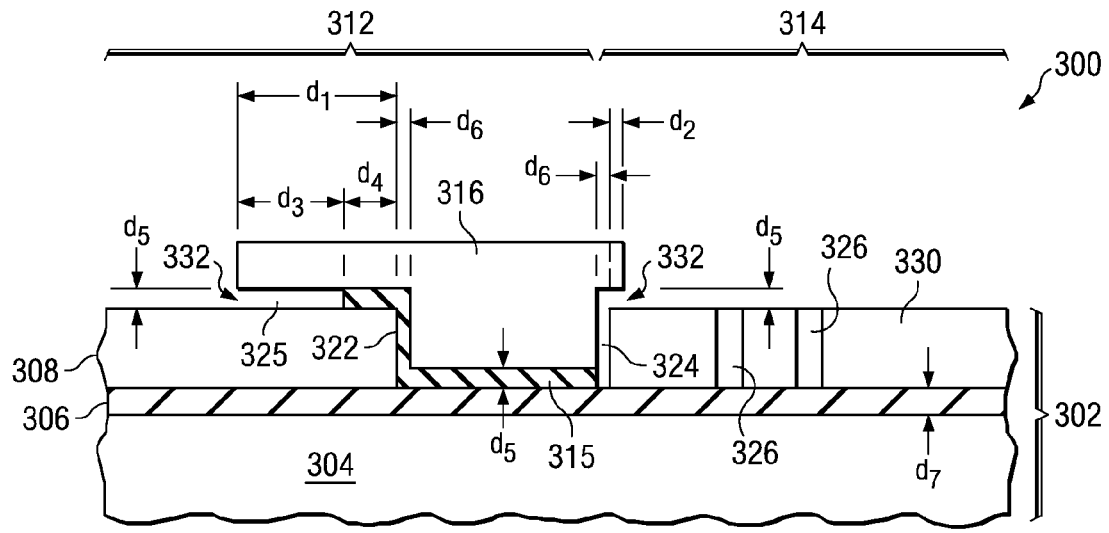
Figure 13:
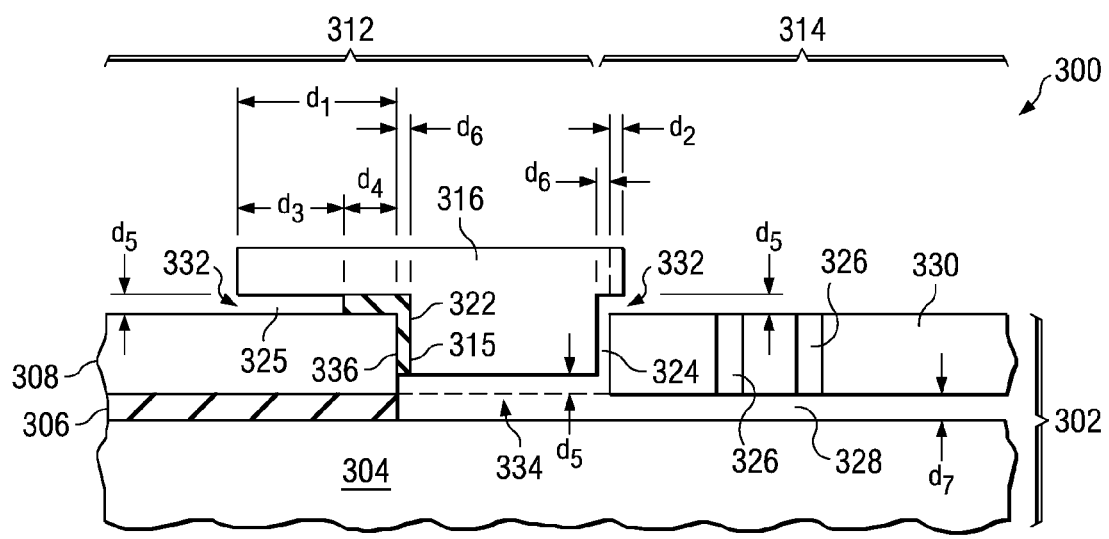

In the previous embodiments described herein, the insulating material layers 115 and 215 comprise a conformal material layer. The insulating material layers 115 and 215 may also be non-conformal. For example, FIGS. 11 through 13 show cross-sectional views of a method of manufacturing a MEMS device 300 at various stages in accordance with another embodiment of the present invention, wherein the thin insulating material layer 315 used to form the inactive and active gaps 322 and 324 comprises a greater thickness or dimension $d_5$ on top surfaces than on sidewalls of the trenches 310, which have a thinner dimension $d_6$. Again, like numerals are used for the various elements that were used to describe the previous figures, and to avoid repetition, each reference number shown in FIGS. 11 through 13 is not described again in detail herein.

In this embodiment, the insulating material layer 315 may be formed using a non-conformal deposition process that results in the insulating material layer 315 forming in a greater thickness $d_5$ on top surfaces. Forming the insulating material layer 315 may comprise using an anisotropic deposition process, leaving an insulating material layer 315 comprising a greater thickness $d_5$ over the top surface of the first semiconductive material 308 and over the top surface of the buried oxide layer 306 within the trenches 310 than over the first and second sidewalls of the trenches 310 having dimension $d_6$, as shown in FIG. 11. This results in a wider opening 332 proximate the first and second sidewalls of the trenches 310 shown in FIG. 12, which facilitates the etch process used to release the buried oxide layer 306 from portions of the MEMS device 300, shown in FIG. 13. Advantageously, the thickness of the insulating material layer 315 may be adjusted to achieve the desired opening 332 size, for example.

Figure 14:
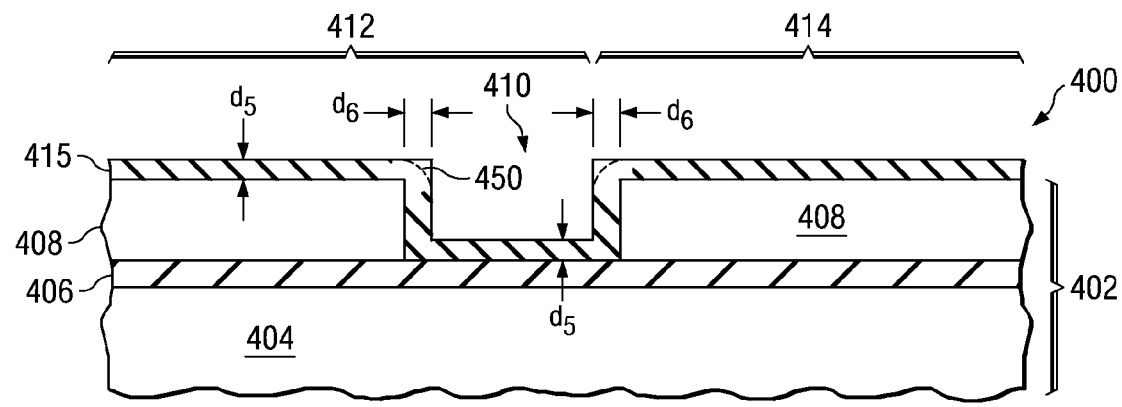
FIGS. 14 through 16 show cross-sectional views of a method of manufacturing a MEMS device at various stages in accordance with yet another embodiment of the present invention, wherein the thin insulating material layer used to form the gap comprises a greater thickness on sidewalls of features than on top surfaces.
Figure 15:
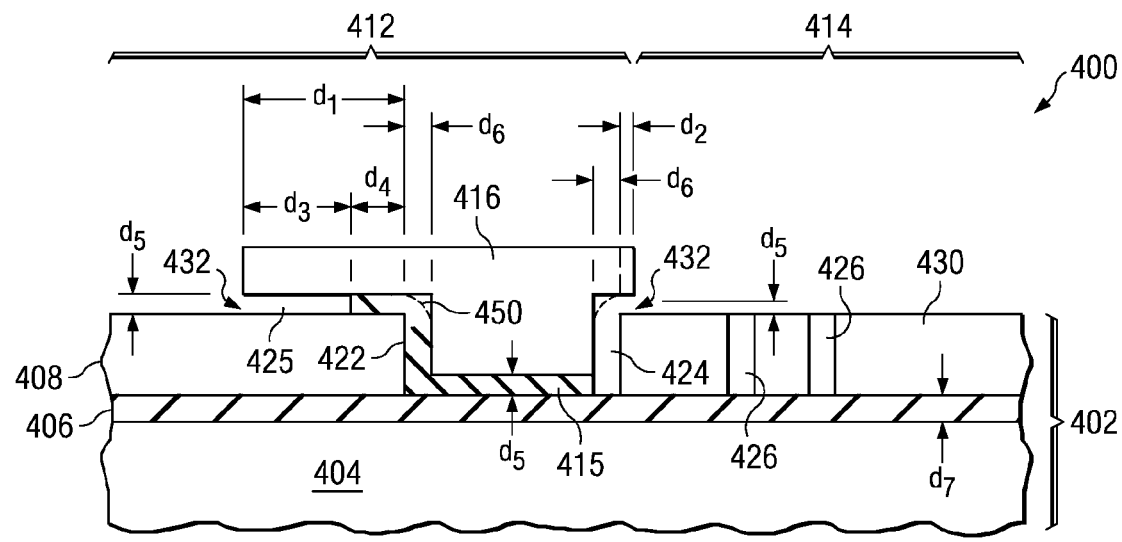
Figure 16:
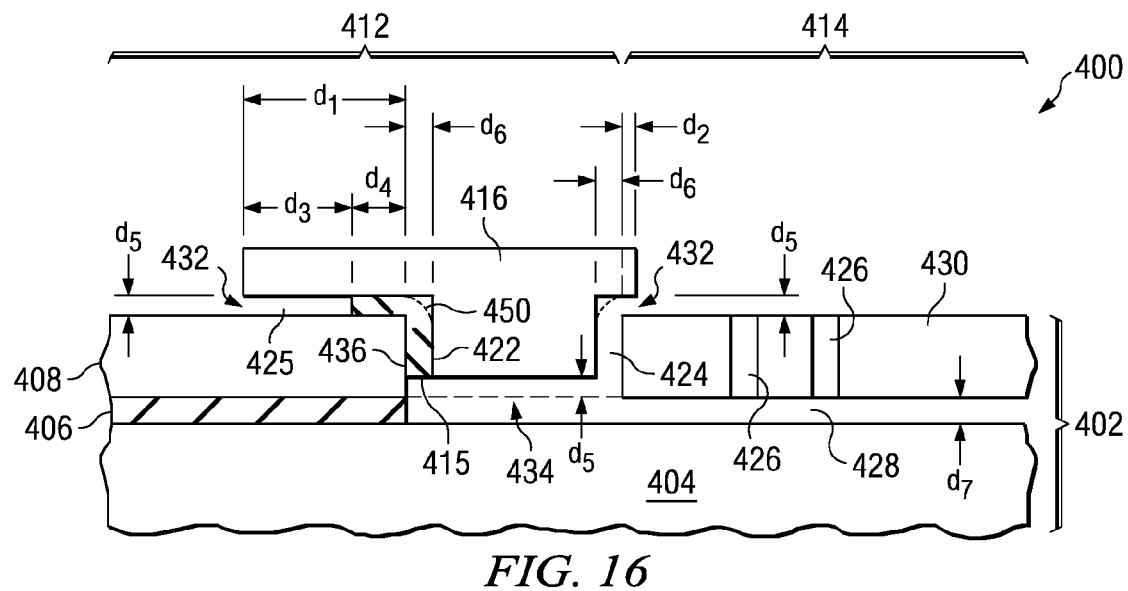

FIGS. 14 through 16 show cross-sectional views of a method of manufacturing a MEMS device 400 at various stages in accordance with yet another embodiment of the present invention, wherein the thin insulating material layer 415 used to form the inactive and active gaps 422 and 424 comprises a greater thickness $d_6$ on sidewalls of features than on top surfaces having a thinner dimension $d_5$. Again, like numerals are used for the various elements that were used to describe the previous figures, and to avoid repetition, each reference number shown in FIGS. 14 through 16 is not described again in detail herein.

The insulating material layer 415 may be conformal as deposited in this embodiment, and an anisotropic etch process may be used to remove a portion of the insulating material layer 415 from over the top surface of the first semiconductive material 408 and also from over the buried oxide layer 406. For example, after forming the insulating material layer 415, a method of manufacturing the MEMS device 400 may include anisotropically etching the insulating material layer 415, leaving an insulating material layer 415 comprising a greater dimension or thickness $d_6$ over the first and second sidewalls of the trench 410 than over the top surface of the first semiconductive material 408 and than over the top surface of the buried oxide layer 406 having dimension $d_5$. Note that the anisotropic etch process may result in tapered sidewalls at the corners and edges of the top of the trench 410, as shown in phantom in FIG. 14 at 450.

In this embodiment, the openings 432 proximate the inactive gap 422 and active gap 424 are narrowed as shown in FIGS. 15 and 16. Advantageously, the openings 432 may be made narrower to limit the amount of insulating material layer 415 that is removed proximate the inactive gap 422, ensuring strong structural support for the electrodes formed from the second semiconductive material or conductive material 416, in some embodiments, as shown in FIG. 16.

Note that the optional first insulating material layer 240 shown in FIGS. 5 through 9 may also be implemented and included in the embodiments shown in FIGS. 11 through 13 and FIGS. 14 through 16, for example, to provide further control of the dimensions $d_5$ of the openings 332 and 432 proximate the inactive gaps 322 and 422 and the active gaps 324 and 424, in accordance with embodiments of the present invention, not shown in the figures.

The amount of the sacrificial insulating material layer 115, 215, 315, and 415 that is removed, e.g., having dimensions $d_5$ and $d_6$, may advantageously be controlled by designing the size of the openings 132, 232, 332, and 432 as desired, e.g., by controlling the dimension $d_5$ or dimension $(d_5+d_8)$ using anisotropic deposition or etch processes for the insulating material layers 115, 215, 315, and 415, and also by including or not including the optional first insulating material layer 240 comprising dimension $d_8$, for example.

Figure 17:
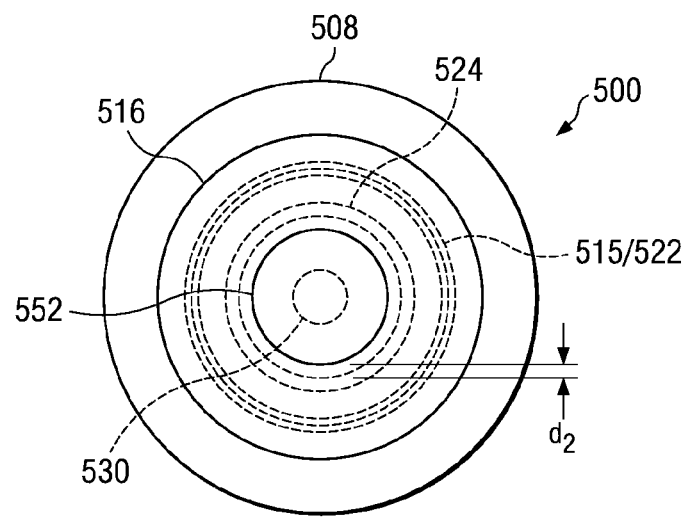
FIG. 17 shows a top view of yet another embodiment of the present invention, wherein a MEMS device comprises a circular-shaped resonator.

The moveable elements 130, 230, 330, and 430 comprised of the first semiconductive material 108, 208, 308, and 408 described herein may comprise a variety of shapes. The moveable elements 130, 230, 330, and 430 may comprise the shape of a rectangle, square, octagon, polygon, circle, or ellipse in a top view of the MEMS devices 100, 200, 300, and 400, as examples, although other shapes may also be used. The moveable elements 130, 230, 330, and 430 may also comprise the shape of a fork, e.g., similar to a tuning fork. The embodiment shown in FIG. 10 illustrates a MEMS device 200 comprising a resonator 230 having a rectangular shape, for example. As another example, FIG. 17 shows a top view of yet another embodiment of the present invention, wherein a MEMS device 500 comprises a circular-shaped resonator 530. The resonator 530 may include one or more optional anchors 552 disposed above or below the resonator 530 in other material layers, as shown in phantom, for example.

After the manufacturing process steps for the MEMS devices 100, 200, 300, 400, and 500 described herein, other manufacturing process steps may then be completed to make electrical contact to portions of the MEMS devices 100, 200, 300, 400, and 500, or to vacuum encapsulate the MEMS device 100, 200, 300, 400, and 500 structures, for example, not shown.

Embodiments of the present invention include MEMS devices 100, 200, 300, 400, and 500 fabricated using the methods and comprising the novel structures described herein. Embodiments of the present invention also include methods of fabricating the MEMS devices 100, 200, 300, 400, and 500 described herein, for example.

Advantages of embodiments of the invention include providing methods of fabricating MEMS devices 100, 200, 300, 400, and 500 wherein the moving semiconductor portion 130, 230, 330, 430, or 530, e.g., which may comprise a resonator 130, 230, 330, 430, or 530 or other moveable MEMS element, is spaced closely to an adjacent semiconductor material, e.g., second semiconductive material or conductive material 116, 216a, 216b, 316, 416, and 516, which may comprise electrodes. A portion of the second semiconductive material or conductive material 116, 216a, 216b, 316, 416, and 516 may reside over the edges of the resonators 130, 230, 330, 430, or 530 in some embodiments, providing a mechanical stop for the moveable elements 130, 230, 330, 430, or 530 within the MEMS devices 100, 200, 300, 400, and 500.

The second semiconductive material or conductive material 116, 216a, 216b, 316, 416, and 516 is spaced apart from the resonators 130, 230, 330, 430, or 530 by a very narrow gap, e.g., the active gap 124, 224, 324, 424, and 524 that may comprise a width of less than a minimum feature size printable by the lithography system used to manufacture the MEMS devices 100, 200, 300, 400, and 500. The active gaps 124, 224, 324, 424, and 524 and inactive gaps 122, 222, 322, 422, and 522 may comprise a thickness of about 100 nm or less in accordance with embodiments of the present invention, for example.

The close lateral proximity of the second semiconductive material or conductive material 116, 216a, 216b, 316, 416, and 516 to the moveable elements 130, 230, 330, 430, or 530 provides improved electromechanical coupling for the MEMS devices 100, 200, 300, 400, and 500. Because the active gap 124, 224, 324, 424, and 524 is formed using a sacrificial thin insulating material layer 115, 215, 315, 415, and 515, a very small gap 124, 224, 324, 424, and 524 may be achieved, for example.

Using a non-conformal sacrificial layer for the insulating material layers 115, 215, 315, 415, and 515 may provide further advantages in some applications. Using insulating material layers 115, 215, 315, 415, and 515 wherein the material on sidewalls is thinner than on top surfaces may provide less parasitic capacitances in some applications, and may also be advantageous in applications where the floating pieces (e.g. the moveable elements 130, 230, 330, 430, and 530) require more lateral support from the anchoring electrodes 116, 216a, 216b, 316, 416, and 516. Using insulating material layers 115, 215, 315, 415, and 515 wherein the material on sidewalls is thicker than on top surfaces may be advantageous in applications requiring more vertical support for the anchoring electrodes 116, 216a, 216b, 316, 416, and 516, for example.

Embodiments of the present invention are easily implementable in existing manufacturing process flows for MEMS devices 100, 200, 300, 400, and 500, with few additional processing steps being required for implementation of the invention, for example. Very narrow gaps, e.g., active gaps 124, 224, 324, 424, and 524 may be fabricated by the methods described herein. A high accuracy of the active gap 124, 224, 324, 424, and 524 dimension is achieved, because a deposition process, oxidation, or nitridation process is used to define the active gap 124, 224, 324, 424, and 524 (e.g., by the formation of the sacrificial insulating material layer 115, 215, 315, 415, and 515), wherein variations in the active gap 124, 224, 324, 424, and 524 dimension of about 1 nm or less are achievable, for example.

Silicon resonator devices 100, 200, 300, 400, and 500 are described herein having sub-100 nm vertical active gaps 124, 224, 324, 424, and 524 dimensions between electrodes 116, 216a, 216b, 316, 416, and 516 and a single crystalline resonator 130, 230, 330, 430, and 530 structure. The moveable elements 130, 230, 330, 430, and 530 may comprise a shape of a beam, wheel, plate, or other shapes, and may be implemented in electrostatically driven MEMS devices 100, 200, 300, 400, and 500, for example. MEMS devices 100, 200, 300, 400, and 500 may be fabricated using the techniques described herein that have a low motional resistance and a high quality factor, and that are adapted to operate at standard CMOS compatible operating voltages.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a micro-electromechanical system (MEMS) device, the method comprising:
    forming a buried oxide layer over a substrate;
    forming a first semiconductive material over the buried oxide layer;
    forming at least one trench in the first semiconductive material and the buried oxide layer, the at least one trench comprising a first sidewall and a second sidewall opposite the first sidewall;
    forming an insulating material layer over at least a portion of the first sidewall of the at least one trench, wherein the insulating material layer is not an air gap;
    forming a second semiconductive material within the at least one trench; and
    forming a first gap in an upper portion of the at least one trench, the first gap being formed between the second semiconductive material and the second sidewall of the at least one trench in the first semiconductive material.

2. The method according to claim 1, wherein the first semiconductive material comprises single crystal silicon, wherein the second semiconductive material comprises polysilicon.

3. The method according to claim 1, wherein the first semiconductive material forms part of a moveable element comprising a resonator, an oscillating element, an actuator, a sensor, a switch, or an accelerometer.

4. The method according to claim 1, wherein forming the at least one trench comprises:
    forming a first trench adjacent a first side of a portion of the first semiconductive material, and
    forming a second trench adjacent a second side of the portion of the first semiconductive material, the second side being opposite the first side.

5. The method according to claim 4, further comprising:
    forming a second gap between the substrate and the second semiconductive material within a lower portion of the at least one trench; and
    forming a third gap between the substrate and the portion of first semiconductive material between the first trench and the second trench, wherein the portion of the first semiconductive material between the first trench and the second trench comprises a moveable element, and wherein the second semiconductive material on the first side and the second side of the moveable element within the first trench and the second trench, respectively, comprise electrodes.

6. The method according to claim 5, wherein the moveable element substantially comprises a shape of a rectangle, square, octagon, polygon, circle, ellipse, or fork in a top view of the MEMS device.

7. A method of fabricating a micro-electromechanical system (MEMS) device, the method comprising:
    forming a oxide layer over a workpiece;
    forming a first semiconductive material over the oxide layer;

forming a first trench in the first semiconductive material and the oxide layer, the trench comprising a first sidewall and a second sidewall opposite the first sidewall;

forming an insulating material layer over the first semiconductive material, a first portion of the insulating material layer being formed over at least a portion of the first sidewall of the first trench, wherein the insulating material layer comprises an oxide or a nitride material;

forming a semiconductive material or conductive material within the first trench, the semiconductive material or conductive material contacting the first portion of the insulating material layer; and forming a first gap in an upper portion of the first trench, the first gap being formed between the semiconductive material or conductive material and the second sidewall of the first trench.

8. The method according to claim 7, wherein the first semiconductive material comprises single crystal silicon, and wherein the conductive material comprises W, Al, at least one liner, or combinations thereof.

9. The method according to claim 7, wherein the first semiconductive material proximate the first gap comprises a moveable element comprising a resonator, an oscillating element, an actuator, a sensor, a switch, or an accelerometer.

10. The method according to claim 7, wherein the first trench is adjacent a first side of a portion of the first semiconductive material, further comprising a second trench adjacent a second side of the portion of the first semiconductive material, the second side being opposite the first side.

11. The method according to claim 10, further comprising:
forming a second gap between the workpiece and the conductive material within a lower portion of the first trench; and
forming a third gap between the workpiece and the portion of first semiconductive material between the first trench and the second trench, wherein the portion of the first semiconductive material between the first trench and the second trench comprises a moveable element, and wherein the conductive material on the first side and the second side of the moveable element within the first trench and the second trench, respectively, comprise electrodes.

12. The method according to claim 11, wherein the moveable element substantially comprises a shape of a rectangle, square, octagon, polygon, circle, ellipse, or fork in a top view of the MEMS device.

13. The method according to claim 10, further comprising forming a release hole within the portion of the first semiconductive material.

14. The method accordingly to claim 7, wherein forming a semiconductive material or conductive material within the first trench comprises forming a conductive material within the first trench and wherein the conductive material is disposed over the first trench.

15. A method of manufacturing a micro-electromechanical system (MEMS) device, the method comprising:
providing a workpiece, the workpiece comprising a substrate, a buried oxide layer disposed over the substrate, and a first semiconductive material disposed over the buried oxide layer, the first semiconductive material having a top surface;

forming at least one trench in the first semiconductive material, the at least one trench comprising a first sidewall and a second sidewall opposite the first sidewall;

forming an insulating material layer over the first and second sidewalls of the at least one trench, and the top surface of the buried oxide layer;

disposing a second semiconductive material or a conductive material over the insulating material layer;

removing portions of the second semiconductive material or the conductive material thereby leaving the second semiconductive material or the conductive material within the at least one trench; and removing the insulating material layer from over the second sidewall of the at least one trench.

16. The method according to claim 15, wherein forming the insulating material layer comprises forming a conformal material.

17. The method according to claim 15, wherein removing the portions of the second semiconductive material or the conductive material comprises:
leaving an amount of the second semiconductive material or the conductive material having a first dimension over the first semiconductive material proximate the first sidewall; and
leaving an amount of the second semiconductive material or the conductive material having a second dimension over the first semiconductive material proximate the second sidewall, wherein the first dimension is larger than the second dimension.

18. The method according to claim 15, further comprising forming at least one release hole in the first insulating material proximate the second sidewall, and removing at least the buried oxide layer at least from beneath the first insulating material proximate the second sidewall, wherein removing the buried oxide layer further comprises removing at least a portion of the buried oxide layer from beneath the second semiconductive material or the conductive material in the at least one trench.

19. The method according to claim 18, wherein removing the buried oxide layer comprises forming a resonator or an oscillating element, further comprising forming an anchor proximate at least one end of the resonator or the oscillating element, above the resonator or the oscillating element, or below the resonator or the oscillating element.

20. The method according to claim 14, further comprising anisotropically etching the insulating material layer, after forming the insulating material layer, leaving an insulating material layer comprising a greater thickness over the first and second sidewalls of the at least one trench than over the top surface of the first semiconductive material and the top surface of the buried oxide layer.

21. The method according to claim 15, wherein forming the insulating material layer comprises using an anisotropic deposition process, leaving an insulating material layer comprising a greater thickness over the top surface of the first semiconductive material and the top surface of the buried oxide layer than over the first and second sidewalls of the at least one trench.

22. The method according to claim 15, further comprising exposing a top surface of the buried oxide layer at a bottom of the at least one trench.

* * * * *